United States Patent
Penney et al.

(10) Patent No.: US 11,482,265 B2
(45) Date of Patent: Oct. 25, 2022

(54) WRITE LEVELING

(71) Applicant: Micron Technology, Inc., Boise, ID (US)

(72) Inventors: Daniel B. Penney, Wylie, TX (US); Gary L. Howe, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/486,481

(22) Filed: Sep. 27, 2021

(65) Prior Publication Data
US 2022/0013156 A1 Jan. 13, 2022

Related U.S. Application Data

(62) Division of application No. 16/779,866, filed on Feb. 3, 2020, now Pat. No. 11,139,008.

(51) Int. Cl.
| | | |
|---|---|---|
| *G11C 7/22* | (2006.01) | |
| *G11C 11/4076* | (2006.01) | |
| *G11C 11/4096* | (2006.01) | |
| *G11C 11/4093* | (2006.01) | |

(52) U.S. Cl.
CPC .......... *G11C 7/222* (2013.01); *G11C 11/4076* (2013.01); *G11C 11/4093* (2013.01); *G11C 11/4096* (2013.01)

(58) Field of Classification Search
CPC ...................................................... G11C 7/22
USPC ....................................................... 365/193
See application file for complete search history.

(56) References Cited

U.S. PATENT DOCUMENTS

| | | | | |
|---|---|---|---|---|
| 7,443,741 B2* | 10/2008 | Butt | ..................... | G11C 7/1006 |
| | | | | 365/174 |
| 10,360,951 B1 | 7/2019 | Penney | | |
| 2009/0091992 A1* | 4/2009 | Lee | ...................... | G11C 7/1096 |
| | | | | 365/193 |
| 2009/0161453 A1* | 6/2009 | Giovannini | ............... | G06F 5/06 |
| | | | | 365/193 |
| 2010/0124131 A1* | 5/2010 | Onishi | .................... | G11C 7/225 |
| | | | | 365/193 |
| 2012/0137084 A1 | 5/2012 | Ok | | |
| 2013/0265835 A1* | 10/2013 | Lee | ......................... | G11C 7/109 |
| | | | | 365/193 |
| 2015/0213875 A1* | 7/2015 | Tokuhiro | ............. | G06F 13/1689 |
| | | | | 365/189.05 |
| 2019/0164583 A1 | 5/2019 | Penney | | |

(Continued)

FOREIGN PATENT DOCUMENTS

CN 108231110 6/2018

OTHER PUBLICATIONS

Chinese Application No. 202011353492.4 Office Action dated Nov. 24, 2021, 6 pgs.

*Primary Examiner* — Muna A Techane
(74) *Attorney, Agent, or Firm* — Fletcher Yoder, P.C.

(57) ABSTRACT

A memory device includes a command interface configured to receive a write command and internal write adjust (IWA) circuitry. The IWA circuitry is configured to receive the write command from the command interface, generate an internal write signal (IWS) based upon the received write command and train a data strobe (DQS) signal to generate a DQS signal having a set amount of phase alignment with a clock (CLK) of the memory device to capture a data signal (DQ) using the IWS.

20 Claims, 7 Drawing Sheets

(56) References Cited

U.S. PATENT DOCUMENTS

2019/0235760 A1 8/2019 Howe et al.
2019/0348094 A1 11/2019 Park et al.

* cited by examiner

WRITE LEVELING

CROSS-REFERENCE TO RELATED APPLICATIONS

The present application is a divisional of U.S. application Ser. No. 16/779,866, entitled "Write Leveling," and filed Feb. 3, 2020, now U.S. Pat. No. 11,139,008, which issued on Oct. 5, 2021, the entirety of which is incorporated by reference herein for all purposes.

BACKGROUND

Field of the Present Disclosure

Embodiments of the present disclosure relate generally to the field of semiconductor devices. More specifically, embodiments of the present disclosure relate to modification of write leveling signal using a modified internal write leveling cycle in memory devices.

Description of Related Art

Semiconductor devices (e.g., memory devices) utilize timing with phase shifts of data signals, data strobes, and/or other signals to perform operations. Data strobes are used to capture data. To ensure that the data strobe signals are timed properly to capture data signals in, write leveling may be used to adjust timing for the data strobe signals to ensure that the data signals are captured properly. The use of write leveling allows the system to compensate for timing differences on a module between the clock path to each memory device and data signals (DQ) and data strobe (DQS) paths. It is important for the write leveling to be accurate, else the timing differences will not be mitigate for, causing the device to operate outside of specifications.

Embodiments of the present disclosure may be directed to one or more of the problems set forth above.

DETAILED DESCRIPTION

Figure 1:
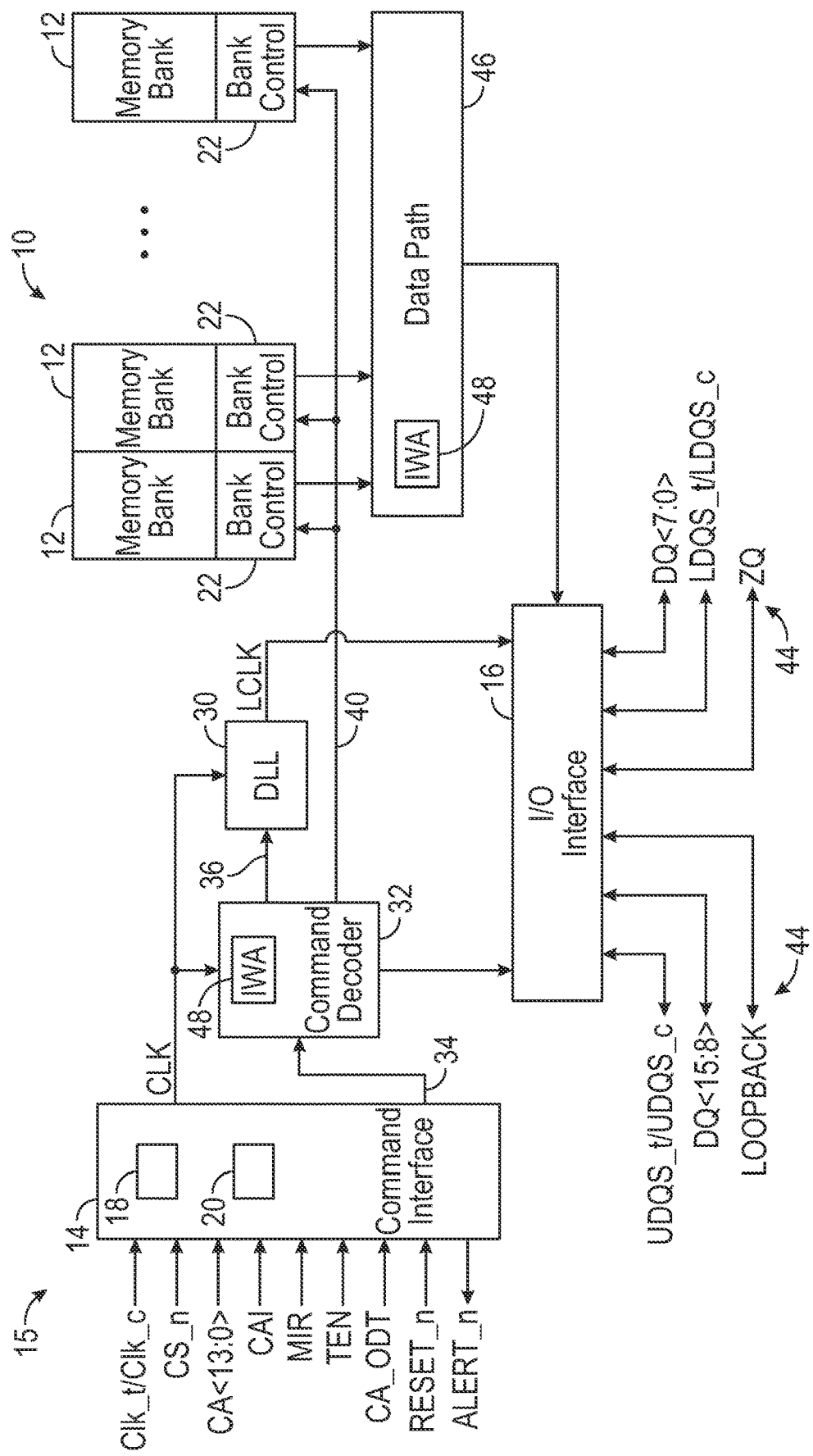
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

To ensure that the data strobe (DQS) signals are timed properly to capture data signals (DQ), write leveling may be used to adjust the DQS signals. In some embodiments, write leveling may be employed at power-up of a memory device, during a clock change, and/or due to system-level decisions (e.g., when too much variation occurs on clocking and clocking is reset). Write leveling may be classified as external write leveling and/or internal write leveling. External write leveling includes sending signals back to a host device telling the host device whether a system level clock was able to be aligned with the DQS signals at pins of the memory device 10.

Internal write leveling may be completed subsequent to the external write leveling. Internal write leveling, for example, allows for a memory to shift a timing at which it launches an internal write command (e.g., an internal write signal (IWS)) to be captured by the DQS domain. Accordingly, internal write leveling utilizes IWS circuitry to launch the IWS after a write is received from the host device and may be performed using instructions from the host device. The internal write leveling causes the launch to occur some number (N) of cycles earlier than a programmed CAS (column access strobe) Write Latency (CWL) for the memory device to ensure that the DQS signal may capture the IWS properly.

A double data rate type five synchronous dynamic access memory (DDR5 SDRAM) device has a specification that includes internal write leveling inclusive of a final positive phase shift of a data strobe (DQS) signal by a host device. Following completion of both write leveling steps (external and internal leveling, i.e., the entire write leveling training process), the DDR5 specification allows for a timing offset (DQS to CLK phase alignment) of between −0.5 tCK (DQS minus a half clock pulse) and +0.5 tCK (DQS plus a half clock pulse), where tCK is the time for one tick of a clock (CK).

Keeping the timing offset within spec is useful, especially when multiple ranks of memory are present and share a DQ bus and a DQS bus, as switching between ranks of the memory device 10 (e.g., switching from writing to rank 0 to writing to rank 1) typically includes the addition of a timing bubble (one or more clock cycles). If the timing offset is not within spec, additional clock cycles are added to the timing bubble, which reduces the performance of the memory. When sources of internal error (e.g., certain voltage, temperature, and/or clock rate conditions, path matching delay, CAS (column access strobe) latency, internal change for write cycle, etc.) occur, boundary cases exist where the timing offset after write level training is outside the 1 tCK window of the specification.

Accordingly, present embodiments describe a technique and circuitry to modify and/or mitigate an out of specification timing offset after write leveling (e.g., write level training). Generally, the resolution when performing internal write leveling is one clock. Upon completion of the external write leveling, ideally, an aligned DQS and clock signal would be generated. However, because of internal sources of error, the aligned DQS and clock signal may be misaligned (i.e., out of phase with one another by more than a threshold amount, such as a quarter clock cycle). Accordingly, when loading mode registers to shift the internal timing of the write signal (IWS), with a resolution of one clock, the internal write leveling process may cause an out of specification offset value between the DQS and the clock. Present embodiments alter this resolution from one clock to ½ a clock for a write internal cycle adjust (WICA) value based on timing relationships.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a DDR5 SDRAM device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the bar clock signal (Clk_b). The positive clock edge for DDR refers to the point where the rising true clock signal Clk_t/crosses the falling bar clock signal Clk_b, while the negative clock edge indicates that transition of the falling true clock signal Clk_t and the rising of the bar clock signal Clk_b. Commands (e.g., read command, write command, etc.) are typically entered on the positive edges of the clock signal and data is transmitted or received on both the positive and negative clock edges.

The clock input circuit 18 receives the true clock signal (Clk_t/) and the bar clock signal (Clk_b) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/ and Clk_b). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific memory banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the TO interface 16. More specifically, the data may be sent to or retrieved from the memory banks 12 over the datapath 46, which includes a plurality of bi-directional data buses. Data TO signals, generally referred to as DQ signals, are generally transmitted and received in one or more bi-directional data busses. For certain memory devices, such as a DDR5 SDRAM memory device, the TO signals may be divided into upper and lower bytes. For instance, for a ×16 memory device, the TO signals may be divided into upper and lower TO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/ and Clk_b), the DQS signals may be provided as a differential pair of data strobe signals (DQS_t/ and DQS_b) to provide differential pair signaling during reads and writes. For certain memory devices, such as a DDR5 SDRAM memory device, the differential pairs of DQS signals may be divided into upper and lower data strobe signals (e.g., UDQS_t/ and UDQS_b; LDQS_t/ and LDQS_b) corresponding to upper and lower bytes of data sent to and from the memory device 10, for instance.

As illustrated in FIG. 1, the command decoder 32 and/or the datapath 46 may include internal write adjust (IWA) circuitry 48 that may be used to phase shift the IWS and/or the DQS to maintain a specified phase relationship therebetween. An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
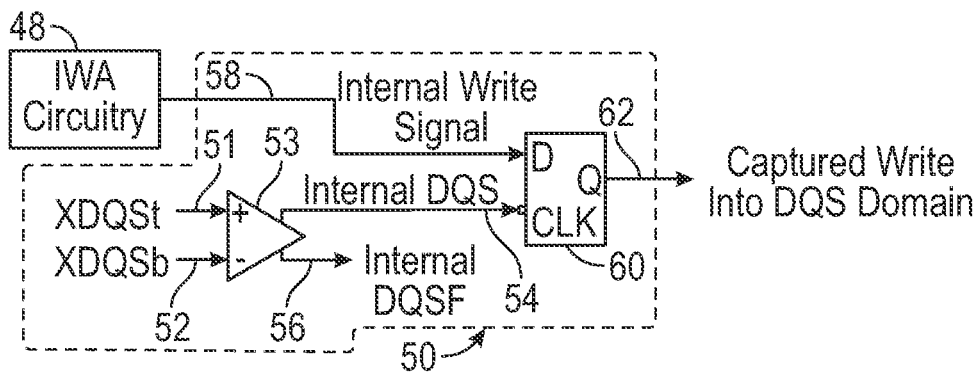
FIG. 2 is a schematic diagram of write capture circuitry that may be implemented in the command decoder and/or the data path of the memory device of FIG. 1, according to an embodiment of the present disclosure.

FIG. 2 is a schematic diagram of write capture circuitry 50 that may be implemented in the command decoder 32 and/or the datapath 46 and utilizes an internal write signal transmitted from IWA circuitry 48. The write capture circuitry 50 receives an external DQS (XDQSt) signal 51 (e.g., UDQS_t) that runs at the same speed as an external clock and may be turned on or off. In some embodiments, the external DQS signal 51 may be accompanied by an external bar DQS (XDQSb) signal 52 that is complementary to the external DQS signal 51. These signals may be transmitted to an amplifier 53 to provide a DQS signal 54 and/or a complementary DQS false signal 56. The amplifier 53 changes the power of the external DQS signal 51 from an external level to a level appropriate for use in the memory device 10.

The DQS signal 54 is used to capture the IWS 58 in the datapath 46 using a flip flop 60 on a correct cycle to successfully begin a write burst and capture incoming write data using a captured write 62 that is in the DQS domain. The external DQS signal 51 and the internal clock (CLK) that generates the IWS 58 may have an unknown phase relationship between them, but the a crossing of the clock domain (e.g., IWS 58) into the DQS domain is to occur at the flip flop 60. Therefore, the phase relationship of the external DQS signal 51 is to be calibrated with respect to the external clock to put the external DQS signal 51 in a position to properly capture the IWS 58 and allow some degree of external variation. Also, in some embodiments, as illustrated, the flip flop 60 may capture the IWS 58 at the falling edge of the DQS signal 54. Additionally or alternatively, the IWS 58 may be captured at the rising edge of the DQS signal 54.

Adjustment of the DQS signal 54, i.e., external write leveling, may be undertaken to ensure that the DQS signal 54 is aligned to CLK at the memory pins of the memory device 10. This adjustment may be accomplished utilizing one or more mode register bits, for example, MR2.1=write leveling (WL) training mode that when enabled (e.g., set to 1) will cause the successful (or not) capture of the IWS 58 by DQS signal 54 to be driven onto the DQ bus ("1"=successful capture). External WL can include, for example, coarse tuning adjustment inclusive of transmission of a write command, determining if the write command is captured (DQ=1), and adjustment of the DQS signal 54 by a positive step, which is repeated until the write command is captured. The external WL can additionally include, for example, fine tuning adjustment subsequent to the coarse tuning adjustment that is inclusive of transmission of an additional write command, determining if the additional write command is captured (DQ=1), and adjustment of the DQS signal 54 by a negative step (smaller in size than the positive step) until the write command is not captured. Once this occurs, the external WL is complete and the DQS signal 54 is aligned to CLK at the memory pins of the memory device 10 (e.g. tDQSoffset=0). At this time, internal WL may proceed.

Figure 3:
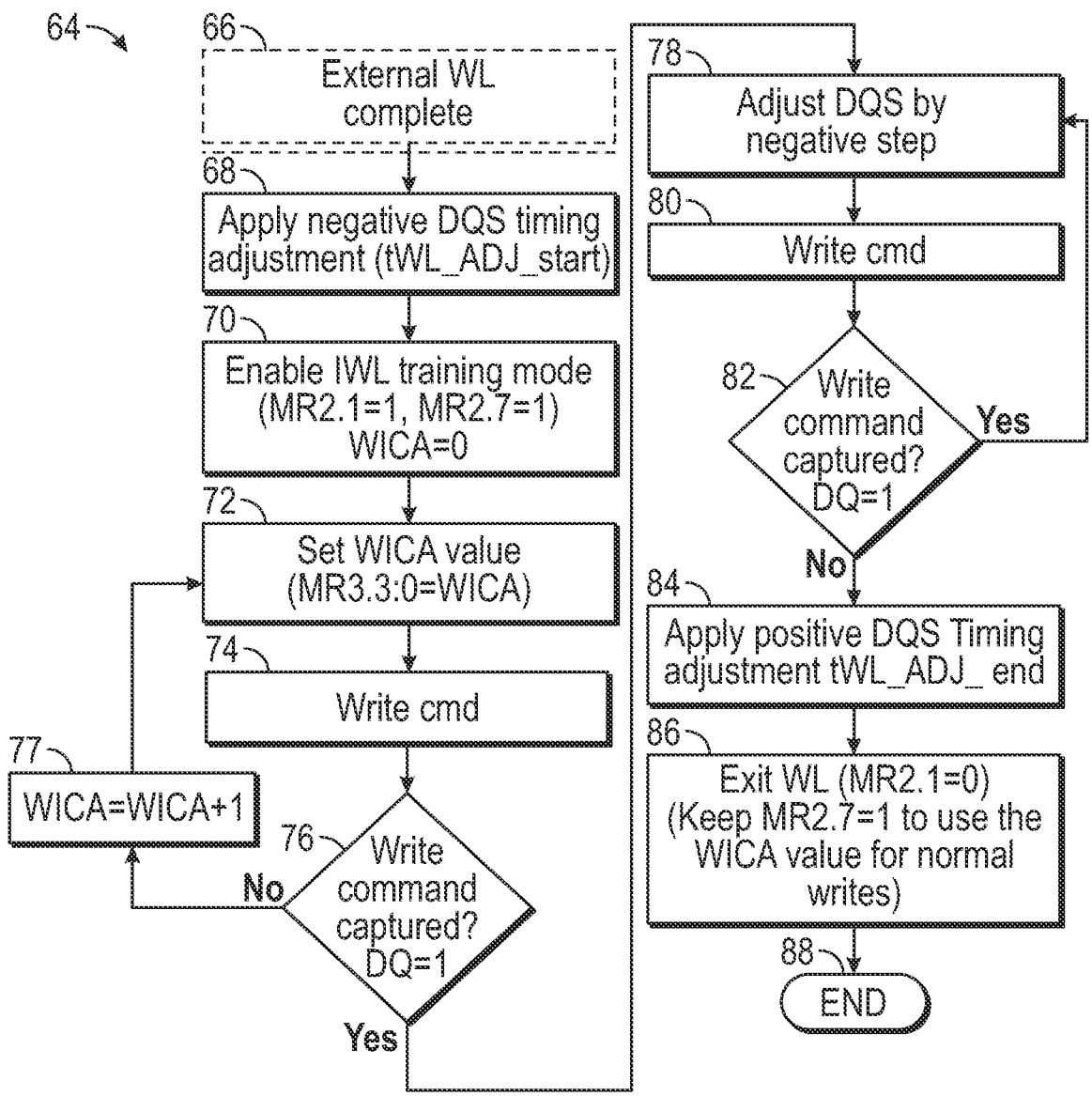
FIG. 3 is a flow diagram of a first process of internal write leveling, in accordance with an embodiment.

FIG. 3 illustrates a flow diagram of one method 64 to execute an internal WL. The process of an internal WL changes which clock cycle (of the CLK) a write command gets shifted out to the DQS domain, i.e., internal WL controls transmission of the IWS 58 from the IWA circuitry 48 so that the IWS 58 can be properly captured in the DQS domain. This method 64 may be performed by, for example, the IWA circuitry 48.

As illustrated, method 64 begins upon completion of the external WL in step 66. In step 68, a negative timing adjustment (e.g., tWL_ADJ_start) may be applied to the DQS signal 54. This step 68 may be performed to correct timing at the end of a data flow and may be performed, for example, in conjunction with specifications of the memory device 10. In step 70, internal WL (e.g., an internal WL training mode) is initiated. In conjunction with step 70, one or more mode registers utilized in conjunction with the initiation of internal WL are set. For example, mode register MR2.1 (which applies to both external WL and internal W) is set to (or remains at) 1. An additional mode register utilized is, for example, MR2.7=Internal Write Timing (Write Internal Cycle Adjust or "WICA" Mode) that when enabled (e.g., set to 1) will cause the IWS 58 to be launched early from a CAS-write-latency (CWL) shifter of the IWA circuitry 48. A further mode register utilized is MR3.3: 0=WICA Value (WICA is how many cycles the memory device 10 will launch the IWS early from the CWL shifter). As illustrated in step 70, the aforementioned mode registers are initially set as follows: mode register MR2.1=1, mode register MR2.7=1, and the initial value for the WICA=0.

In step 72, the mode register MR3.3:0 is set to the current WICA Value, in this case 0, since it is the first time through the method 64. A write command is issued in step 74 and a determination of whether the write command is captured (as a captured write 62) is made in step 76. If the write command is not captured (e.g., the captured write 62 is not present), the WICA value is iteratively adjusted, for example by one clock cycle (so that the IWA circuitry 48 will send the IWS 58 one clock earlier), and the process of steps 72, 74, 76, and 77 is repeated until the write command is captured (the captured write 62 is present) in step 76 using the adjusted WICA value. At this time, the MR3.3:0 is set to the value that indicates the current value of WICA, i.e., which WICA value is the timing at which the IWA circuitry 48 is to launch the IWS 58. This process completes the coarse tuning process of the internal WL.

The captured write 62 may not always coincide with the one clock resolution of the WICA value described above. For example, a WICA value of three may be applied to capture a captured write 62 that is delayed by 2.5 clock cycles (i.e., the IWS 58 is launched from the clock domain three clocks earlier, even if the captures write 62 would be captured if the IWS 58 was launched at least 2.5 clocks earlier). Accordingly, to compensate for this mismatch between the WICA value and the actual capture timing of the captured write 62, fine tuning may be applied as part of the method 64. In step 78, the fine tuning process of method 64 is undertaken.

In step 78, the DQS signal 54 is adjusted by a negative step (i.e., the DQS signal 54 is stepped back by an amount less than the resolution of the WICA, here less than one clock cycle, such as one quarter clock (0.25 tCK) or less). In step 80, a write command is issued and a determination of whether the write command is captured (as captured write 62) is made in step 82. If the write command is captured (e.g., the captured write 62 is present), the DQS signal 54 is adjusted again by a value less than one clock cycle and the process of steps 78, 80 and 82 is repeated until the write command is not captured (e.g., whereby the captured write 62 has just barely (e.g., within 0.25 tCK or less) not been captured).

At this time, in step 84, a positive timing adjustment (e.g., tWL_ADJ_end) may be applied to the DQS signal 54. This step 68 may be performed to correct timing at the end of a data flow and may be performed, for example, in conjunction with specifications of the memory device 10. It should be noted that the tWL_ADJ_start of step 68 and the tWL_ADJ_end of step 84 are timing adjustments intended to move the IWS 58 capture from the boundary condition (clock cycle) in which the IWS was captured. Accordingly, the tWL_ADJ_start of step 68 and the tWL_ADJ_end of step 84 operate as buffering adjustments and the amount of buffering applied may be set by a user and/or may be a part of the specs of the memory device 10.

At this time, in step 86, the internal WL is exited. This step 86 includes setting of the value of the mode register MR2.1=0, mode register MR2.7=1, and setting of MR3.3:0 to the value that indicates the determined WICA cycle from steps 72, 74, 76, and 77. In step 88, the entire write leveling operation is ended (completed). At this time, the DQS signal 54 to clock timing is set and due to the above described buffering, for example, the tWL_ADJ_start of step 68 and/or the tWL_ADJ_end of step 84, the phase of the DQS signal 54 may be not be zero. Instead, the DQS signal 54 may have an offset (e.g., tDQSoffset) of between a half a clock earlier than the clock (−0.5 tCK) or half a clock later than the clock (+0.5 tCK) and still be within the tolerances or specifications of the memory device 10.

Figure 4:
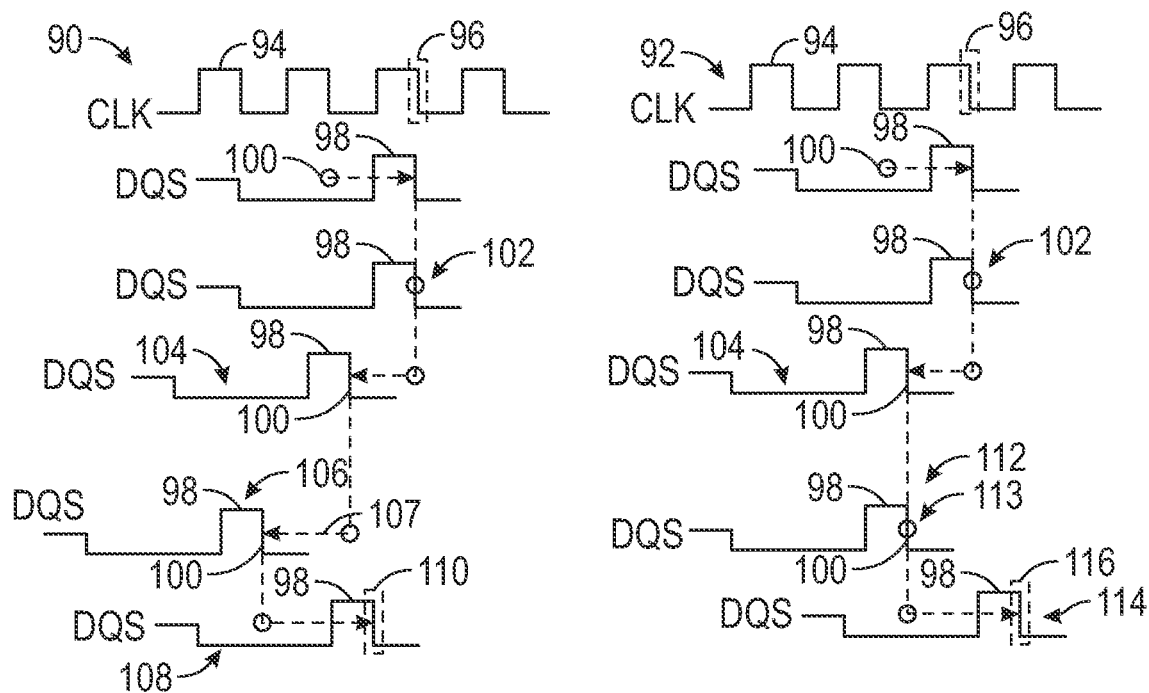
FIG. 4 is a diagram illustrating a first example of a minimum boundary case and a maximum boundary case in conjunction with the internal write leveling of FIG. 3, in accordance with an embodiment.
Figure 5:
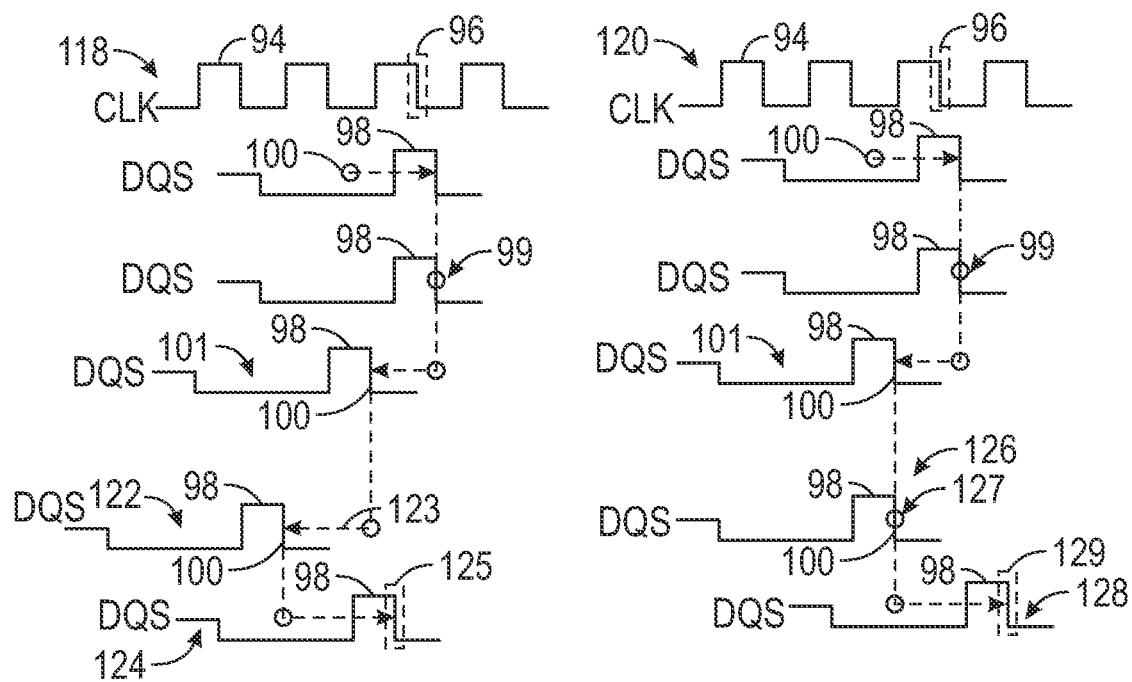
FIG. 5 is a diagram illustrating a second example of a minimum boundary case and a maximum boundary case in conjunction with the internal write leveling of FIG. 3, in accordance with an embodiment.
Figure 6:
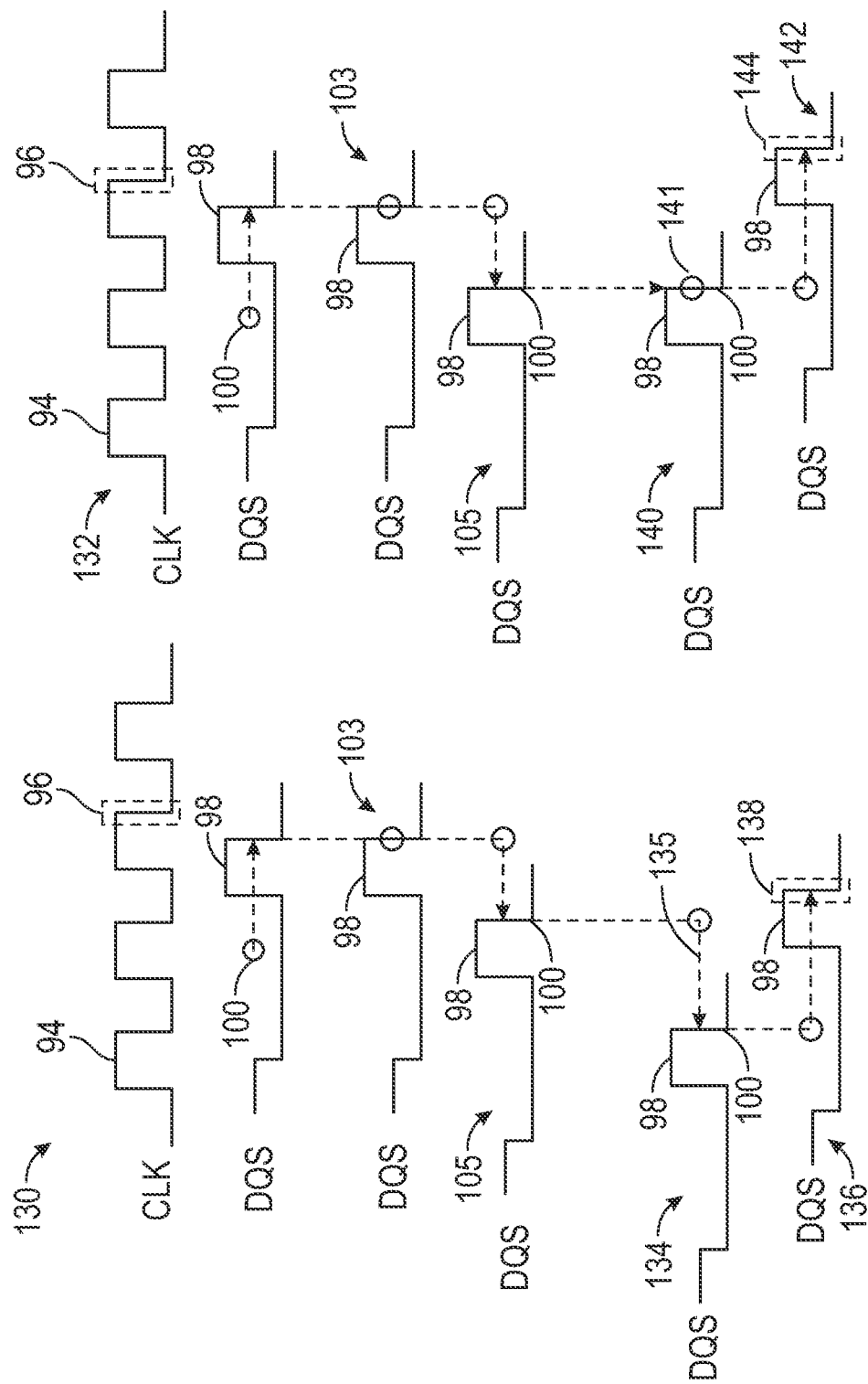
FIG. 6 is a diagram illustrating a third example of a minimum boundary case and a maximum boundary case in conjunction with the internal write leveling of FIG. 3, in accordance with an embodiment.

FIGS. 4-6 below describe examples of timing situations that may occur when implementing the internal WL method 64 described above. For FIGS. 4-6, there is a preamble setting (Wpre) of how many clocks pulses (of the CLK) are transmitted before data is input. In the present embodiments, the DQS signal 54 toggles twice (i.e., Wpre=2) before the clock edges that capture the data. Likewise, for FIGS. 4-6, the clock rate (tCK)=400 picoseconds (ps). Accordingly, a quarter clock rate (0.25 tCK)=100 ps. Likewise, for FIGS. 4-6, units are in tCK unless otherwise noted.

FIG. 4 illustrates a diagram of a minimum boundary case 90 and a maximum boundary case 92 for the DQS signal 54 that each result in no final offset (e.g., tDQSoffset) of outside of half a clock earlier than the clock (−0.5 tCK) or half a clock later than the clock (+0.5 tCK). As illustrated, a CLK clock waveform 94 is present in each of the minimum boundary case 90 and the maximum boundary case 92. With respect to the minimum boundary case 90, upon conclusion of the external WL (step 66), the DQS signal 54 and the clock are aligned (e.g., tDQSoffset is equal to or less than 0.1 ps). The box 96 on the clock waveform 94 indicates an alignment edge (the preamble fall edge preceding the first data bit).

The DQS pulse 98 has a falling edge 100 used to capture the write command. As previously noted, after external WL (illustrated by waveform 102), the DQS signal 54 and the clock are aligned (e.g., tDQSoffset is equal to or less than 0.1 ps). In conjunction with waveform 104, the DQS pulse 98 has negative timing adjustment applied (associated with step 68). This adjustment may be, for example, −0.75 tCK. WICA is increased (in conjunction with steps 72, 74, 76, and 77) until the falling edge 100 of the DQS pulse 98 captures the write command. With respect to the minimum boundary case 90, the WICA for a given value just barely (e.g., within 0.25 tCK or less) misses a capture of the write command as it is incremented.

Once the write command is captured, the fine tuning process of method 64 is undertaken (e.g., steps 78, 80, and 82) resulting in waveform 106. Waveform 106 illustrates that the fine tuning process of method 64 steps back approximately 1 tCK (time 107) until the failing boundary is determined (step 82). Thereafter, as illustrated by waveform 108, a positive timing adjustment (e.g., tWL_ADJ_end) is applied to the DQS signal 54. As illustrated, this positive timing adjustment is +1.25 tCK and it results in the DQS pulse 98 having its falling edge 100 used to capture the write command illustrated as being in the box 110 (indicative of the alignment edge of the DQS signal 54). The illustrated waveform 108 represents the final tDQSoffset being −0.5 tCK, i.e., the DQS signal 54 having an offset of half a clock earlier than the CLK.

With respect to the maximum boundary case 92, upon conclusion of the external WL (step 66), the DQS signal 54 and the CLK are aligned (e.g., tDQSoffset is equal to or less than 0.1 ps). The box 96 on the CLK clock waveform 94 indicates an alignment edge (the preamble fall edge preceding the first data bit).

The DQS pulse 98 has a falling edge 100 used to capture the write command. After external WL (illustrated by waveform 102), the DQS signal 54 and the CLK are aligned (e.g., tDQSoffset is equal to or less than 0.1 ps). In conjunction with waveform 104, the DQS pulse 98 has negative timing adjustment applied (associated with step 68). This adjustment may be, for example, −0.75 tCK. WICA is increased (in conjunction with steps 72, 74, 76, and 77) until the falling edge 100 of the DQS pulse 98 captures the write command. With respect to the maximum boundary case 92, the WICA for a given value just barely (e.g., within 0.25 tCK or less) captures a write command as it is incremented.

Once the write command is captured, the fine tuning process of method 64 is undertaken (e.g., steps 78, 80, and 82) resulting in waveform 112. Waveform 112 illustrates that the fine tuning process of method 64 steps back −0.1 ps (time 113) until the failing boundary is determined (step 82). Thereafter, as illustrated by waveform 114, a positive timing adjustment (e.g., tWL_ADJ_end) is applied to the DQS signal 54. As illustrated, this positive timing adjustment is +1.25 tCK and it results in the DQS pulse 98 having its falling edge 100 used to capture the write command illustrated as being in the box 116 (indicative of the alignment edge of the DQS signal 54). The illustrated waveform 114 represents the final tDQSoffset being +0.5 tCK, i.e., the DQS signal 54 having an offset of half a clock later than the CLK.

Thus, FIG. 4 illustrates boundary cases, whereby one boundary case describes a given WICA value resulting in barely (e.g., within 0.25 tCK or less) capturing the write command (the maximum boundary case 92), which also results in a minimal fine tuning process being applied in conjunction with the internal WL. The other boundary case describes a given WICA setting barely (e.g., within 0.25 tCK or less) missing capturing the write command (the minimum boundary case 90), which results in an additional increment of the WICA value to allow for the capture of the write command as well as a corresponding large fine tuning process being applied in conjunction with the internal WL. However, if the DQS signal 54 and the CLK are aligned (e.g., tDQSoffset is equal to or less than 0.1 ps) upon conclusion of the external WL (step 66), the final (resultant) offset for the boundary cases will be at −0.5 tCK and +0.5 tCK (i.e., within a given specification or tolerance of the memory device 10).

Situations may arise, however, in which the tWL_ADJ_start of step 68 and/or the tWL_ADJ_end of step 84 cause the DQS signal 54 to have more than 0.5 cycles of phase mismatch (e.g., a set amount of phase alignment) with the CLK after training (tDQSoffset >±0.5 tCK). For example, internal mismatch from the external WL may occur in which internal path matching is compromised due to changes in voltage and temperature. Similarly, resolution errors in the external WL may result in failure of the CLK and the DQS signal 54 to be aligned. Likewise, internal WICA mux errors may occur when changing the launch of the IWS 58 early out of the CWL shifter from one WICA value to another along with additional types and causes of error. FIGS. 5 and 6 illustrate instances when initial errors in matching of the DQS signal 54 and the CLK or other errors cause the DQS signal 54 to have more than 0.5 cycles of phase mismatch of CLK after training (tDQSoffset>±0.5 tCK).

FIG. 5 illustrates a diagram of a minimum boundary case 118 and a maximum boundary case 120 for the DQS signal 54 that results in a final offset (e.g., tDQSoffset) within half a clock earlier than the CLK (−0.5 tCK) but outside a half a clock later (+0.5 tCK) than the CLK. As illustrated, the clock waveform 94 of the CLK is present in each of the minimum boundary case 118 and the maximum boundary case 120. With respect to the minimum boundary case 118, upon conclusion of the external WL (step 66), the DQS signal 54 and the CLK are misaligned (e.g., tDQSoffset is equal to approximately 100 ps). The box 96 on the clock waveform 94 indicates an alignment edge (the preamble fall edge preceding the first data bit).

The DQS pulse 98 has a falling edge 100 used to capture the write command. As previously noted, after external WL (illustrated by waveform 99), the DQS signal 54 and the CLK are misaligned (e.g., tDQSoffset is equal to approximately 100 ps). In conjunction with waveform 101, the DQS pulse 98 has negative timing adjustment applied (associated with step 68). This adjustment may be, for example, −0.75 tCK. WICA is increased (in conjunction with steps 72, 74, 76, and 77) until the falling edge 100 of the DQS pulse 98 captures the write command. With respect to the minimum boundary case 118, the WICA for a given value just barely misses a capture of the write command as it is incremented.

Once the write command is captured, the fine tuning process of method 64 is undertaken (e.g., steps 78, 80, and 82) resulting in waveform 122. Waveform 122 illustrates that the fine tuning process of method 64 steps back approximately 1 tCK (time 123) until the failing boundary is determined (step 82). Thereafter, as illustrated by waveform 124, a positive timing adjustment (e.g., tWL_ADJ_end) is applied to the DQS signal 54. As illustrated, this positive timing adjustment is +1.25 tCK and it results in the DQS pulse 98 having its falling edge 100 used to capture the write command illustrated as being in the box 125 (indicative of the alignment edge of the DQS signal 54). The illustrated waveform 124 represents the final tDQSoffset being −0.25 tCK, i.e., the DQS signal 54 having an offset of less than half a clock earlier than the CLK (i.e., within a given specification or tolerance of the memory device 10).

With respect to the maximum boundary case 120, upon conclusion of the external WL (step 66), the DQS signal 54 and the CLK are similarly misaligned as the DQS signal 54 and the CLK of the minimum boundary case 118 (e.g., tDQSoffset is equal to approximately 100 ps). The box 96 on the clock waveform 94 indicates an alignment edge (the preamble fall edge preceding the first data bit).

The DQS pulse 98 has a falling edge 100 used to capture the write command. As previously noted, after external WL (illustrated by waveform 99), the DQS signal 54 and the CLK are misaligned (e.g., tDQSoffset is equal to approximately 100 ps). In conjunction with waveform 101, the DQS pulse 98 has negative timing adjustment applied (associated with step 68). This adjustment may be, for example, −0.75 tCK. WICA is increased (in conjunction with steps 72, 74, 76, and 77) until the falling edge 100 of the DQS pulse 98 captures the write command. With respect to the maximum boundary case 120, the WICA for a given value just barely captures a write command as it is incremented.

Once the write command is captured, the fine tuning process of method 64 is undertaken (e.g., steps 78, 80, and 82) resulting in waveform 126. Waveform 126 illustrates that the fine tuning process of method 64 steps back −0.1 ps (time 127) until the failing boundary is determined (step 82). Thereafter, as illustrated by waveform 128, a positive timing adjustment (e.g., tWL_ADJ_end) is applied to the DQS signal 54. As illustrated, this positive timing adjustment is +1.25 tCK and it results in the DQS pulse 98 having its falling edge 100 used to capture the write command illustrated as being in the box 129 (indicative of the alignment edge of the DQS signal 54). The illustrated waveform 128 represents the final tDQSoffset being +0.75 tCK, i.e., the DQS signal 54 having an offset of three quarters of a clock later than the CLK (i.e., outside a given specification or tolerance of the memory device 10). In this manner, errors cause a boundary condition failure for the maximum boundary case 120 when the method 64 is applied.

FIG. 6 illustrates a diagram of a minimum boundary case 130 and a maximum boundary case 132 for the DQS signal 54 that results in a final offset (e.g., tDQSoffset) outside half a clock earlier than the clock (−0.5 tCK) but within a half a clock later (+0.5 tCK) than the CLK. As illustrated, the clock waveform 94 of the CLK is present in each of the minimum boundary case 130 and the maximum boundary case 132. With respect to the minimum boundary case 130, upon conclusion of the external WL (step 66), the DQS signal 54 and the CLK are misaligned (e.g., tDQSoffset is equal to approximately −100 ps). The box 96 on the clock waveform 94 indicates an alignment edge (the preamble fall edge preceding the first data bit).

The DQS pulse 98 has a falling edge 100 used to capture the write command. As previously noted, after external WL (illustrated by waveform 103), the DQS signal 54 and the CLK are misaligned (e.g., tDQSoffset is equal to approximately −100 ps). In conjunction with waveform 105, the DQS pulse 98 has negative timing adjustment applied (associated with step 68). This adjustment may be, for example, −0.75 tCK. WICA is increased (in conjunction with steps 72, 74, 76, and 77) until the falling edge 100 of the DQS pulse 98 captures the write command. With respect to the minimum boundary case 130, the WICA for a given value just barely misses a capture of the write command as it is incremented.

Once the write command is captured, the fine tuning process of method 64 is undertaken (e.g., steps 78, 80, and 82) resulting in waveform 134. Waveform 134 illustrates that the fine tuning process of method 64 steps back approximately 1 tCK (time 135) until the failing boundary is determined (step 82). Thereafter, as illustrated by waveform 136, a positive timing adjustment (e.g., tWL_ADJ_end) is applied to the DQS signal 54. As illustrated, this positive timing adjustment is +1.25 tCK and it results in the DQS pulse 98 having its falling edge 100 used to capture the write command illustrated as being in the box 138 (indicative of the alignment edge of the DQS signal 54). The illustrated waveform 136 represents the final tDQSoffset being −0.85 tCK, i.e., the DQS signal 54 having an offset of more than half a clock earlier than the CLK (i.e., outside a given specification or tolerance of the memory device 10). In this manner, errors cause a boundary condition failure for the minimum boundary case 130 when the method 64 is applied.

With respect to the maximum boundary case 132, upon conclusion of the external WL (step 66), the DQS signal 54 and the CLK are similarly misaligned as the DQS signal 54 and the CLK of the minimum boundary case 130 (e.g., tDQSoffset is equal to approximately −100 ps). The box 96 on the clock waveform 94 indicates an alignment edge (the preamble fall edge preceding the first data bit).

The DQS pulse 98 has a falling edge 100 used to capture the write command. As previously noted, after external WL (illustrated by waveform 103), the DQS signal 54 and the CLK are misaligned (e.g., tDQSoffset is equal to approximately −100 ps). In conjunction with waveform 105, the DQS pulse 98 has negative timing adjustment applied (associated with step 68). This adjustment may be, for example, −0.75 tCK. WICA is increased (in conjunction with steps 72, 74, 76, and 77) until the falling edge 100 of the DQS pulse 98 captures the write command. With respect to the maximum boundary case 132, the WICA for a given value just barely captures a write command as it is incremented.

Once the write command is captured, the fine tuning process of method 64 is undertaken (e.g., steps 78, 80, and 82) resulting in waveform 140. Waveform 140 illustrates that the fine tuning process of method 64 steps back −0.1 ps (time 141) until the failing boundary is determined (step 82). Thereafter, as illustrated by waveform 142, a positive timing adjustment (e.g., tWL_ADJ_end) is applied to the DQS signal 54. As illustrated, this positive timing adjustment is +1.25 tCK and it results in the DQS pulse 98 having its falling edge 100 used to capture the write command illustrated as being in the box 144 (indicative of the alignment edge of the DQS signal 54). The illustrated waveform 142 represents the final tDQSoffset being +0.25 tCK, i.e., the DQS signal 54 having an offset of one quarter of a clock later than the CLK (i.e., within a given specification or tolerance of the memory device 10).

Thus, FIG. 5 illustrates a boundary case (maximum boundary case 120) that describes a given WICA value resulting in barely capturing the write command and that also results in the DQS signal 54 having an offset outside of a given specification or tolerance of the memory device 10. Likewise, FIG. 6 illustrates a boundary case (minimum boundary case 130) that describes a given WICA setting barely missing capturing the write command and that also results in the DQS signal 54 having an offset outside of a given specification or tolerance of the memory device 10. To insure that boundary conditions will not result in the DQS signal 54 having an offset outside of a given specification or tolerance of the memory device 10, a second embodiment of internal WL is described below in conjunction with FIG. 7.

Figure 7:
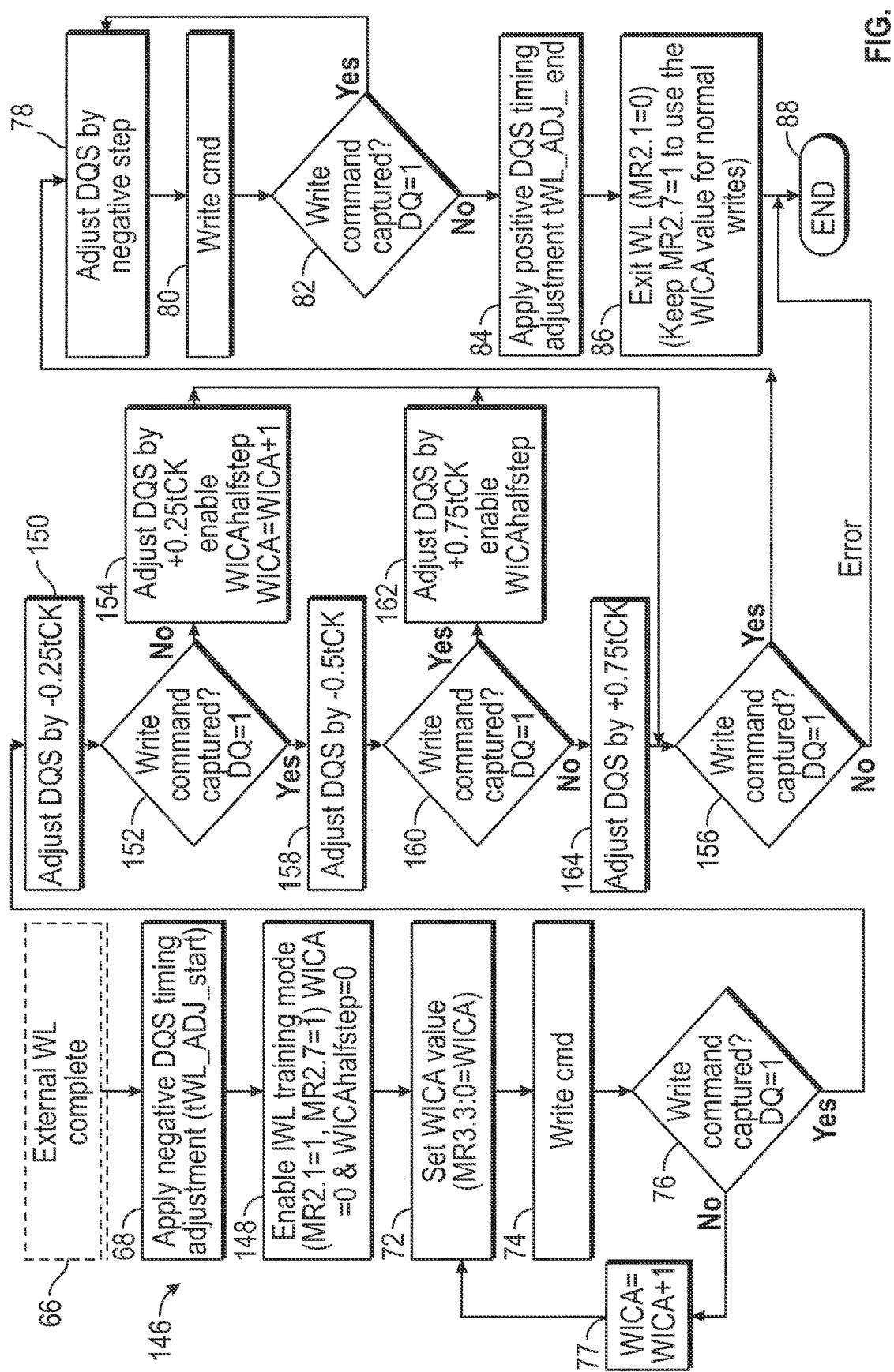
FIG. 7 is a flow diagram of a second process of internal write leveling, in accordance with an embodiment.

FIG. 7 illustrates a flow diagram of a method 146 to execute an internal WL in conjunction with another embodiment. The process of internal WL changes which clock cycle (of the CLK) a write command gets shifted out to the DQS domain, i.e., internal WL controls transmission of the IWS 58 from the IWA circuitry 48 so that the IWS 58 can be properly captured in the DQS domain. This method 146 may be performed by, for example, the IWA circuitry 48.

As illustrated, method 146 begins upon completion of the external WL in step 66. In step 68, a negative timing adjustment (e.g., tWL_ADJ_start) may be applied to the DQS signal 54. This step 68 may be performed to correct timing at the end of a data flow and may be performed, for example, in conjunction with specifications of the memory device 10. In step 148, internal WL (e.g., an internal WL training mode) is initiated. In conjunction with step 148, one or more mode registers utilized in conjunction with the initiation of internal WL are set. For example, mode register MR2.1 (which applies to both external WL and internal W) is set to (or remains at) 1. An additional mode register utilized is, for example, MR2.7=Internal Write Timing (Write Internal Cycle Adjust or "WICA" Mode) that when enabled (e.g., set to 1) will cause the IWS 58 to be launched early from a CAS-write-latency (CWL) shifter of the IWA circuitry 48. A further mode register utilized is MR3.3: 0=WICA Value (WICA is how many cycles the memory device 10 will launch the IWS early from the CWL shifter). Another mode register, MR11.7=WICAhalfStep (when enabled, this mode register allows for the decrease of the effective WICA by 0.5 tCK). As illustrated in step 148, the aforementioned mode registers are initially set as follows: mode register MR2.1=1, mode register MR2.7=1, the initial value for WICA=0, and the initial value for WICAhalfStep=0.

In step 72, the mode register MR3.3:0 is set to the current WICA Value, in this case 0, since it is the first time through the method 146. A write command is issued in step 74 and a determination of whether the write command is captured (as captured write 62) is made in step 76. If the write command is not captured (e.g., the captured write 62 is not present), the WICA value is iteratively adjusted, for example by one clock cycle (so that the IWA circuitry 48 will send the IWS 58 one clock earlier), and the process of steps 72, 74, 76, and 77 is repeated until the write command is captured (the captured write 62 is present) in step 76 using the adjusted WICA value. At this time, the MR3.3:0 is set to the value that indicates the current value of WICA, i.e., which WICA value is the timing at which the IWA circuitry 48 is to launch the IWS 58. This process completes the coarse tuning process of the internal WL.

In contrast to method 64, in which the next step would be step 78, method 146 moves to step 150 upon completion of the coarse tuning of the internal WL. Beginning with step 150, a determination is made as to whether a boundary case is present (e.g., the maximum boundary case 120 or the minimum boundary case 130) that would cause the DQS signal 54 to have an offset outside of a given specification or tolerance of the memory device 10 (as well as to correct for this determined occurrence). That is, method 146 includes a boundary condition detection and correction process. As a portion of this boundary condition detection and correction process, in step 150, the DQS signal 54 is reduced (i.e., moved negatively) by a value, for example, a quarter of a clock pulse of the CLK (−0.25 tCK). This step 150 is initiates the boundary test near portion of the boundary condition detection and correction process. In step 152, a determination is made as to whether the write command is captured subsequent to moving the DQS signal 54 by the value (−0.25 tCK) to determine if the WICA for a given value just barely captured a write command, such as in the maximum boundary case 120.

If the write command is not captured in step 152, a determination that a near boundary condition exists is made and in step 154, the DQS signal 54 is adjusted by a value, for example, +0.25 tCK (e.g., the opposite value of that used in step 150). Additionally, in step 154, the mode register MR11.7 is enabled (i.e., set to 1), which causes the mode register MR11.7 to allow for the decrease of the effective WICA by 0.5 tCK. Thus, when in step 154 WICA is incremented (i.e., WICA=WICA+1), the net effect will be WICA=WICA+0.5. This operates to provide correction via a finer resolution for the value of WICA when the near boundary condition is found to exist that would otherwise cause the DQS signal 54 to have an offset outside a given specification or tolerance of the memory device 10.

In step 156, a sanity check is performed (i.e., determining if the write command is captured with the new finer resolution WICA value) and if the write command is captured, the fine tuning process of the internal WL begins at step 78. Alternatively, if the write command is not captured in step 156, the process ends at step 88 with the generation of an error signal.

Returning to step 152, if the write command is captured in step 152, a determination is made that a near boundary condition does not exist. Accordingly, method 146 proceeds to determine whether a far boundary exists. In step 158, the DQS signal 54 is reduced (i.e., moved negatively) by a set value, for example, a half of a clock pulse of the CLK (−0.5 tCK). This step 158 is initiates the boundary test far portion of the boundary condition detection and correction process. In step 160, a determination is made as to whether the write command is captured subsequent to moving the DQS signal 54 by the set value in combination with the previous negative value from step 150 (i.e., −0.75 tCK) to determine if the prior WICA for a given value just barely missed capturing a write command, such as in the minimum boundary case 130.

If the write command is captured in step 160, a determination that a far boundary condition exists is made and in step 162, the DQS signal 54 is adjusted by a value, for example, +0.75 tCK (e.g., the opposite value of the sum of the values used in steps 150 and 158). Additionally, in step 162, the mode register MR11.7 is enabled (i.e., set to 1), which causes the mode register MR11.7 to allow for the decrease of the effective WICA by 0.5 tCK. Thus, when in step 154 WICA is incremented, the net effect will be WICA=WICA−0.5. This operates to provide correction via a finer resolution for the value of WICA when the far boundary condition is found to exist that would otherwise cause the DQS signal 54 to have an offset outside a given specification or tolerance of the memory device 10.

In step 156, a sanity check is performed (i.e., determining if the write command is captured with the new finer resolution WICA value) and if the write command is captured, the fine tuning process of the internal WL begins at step 78. Alternatively, if the write command is not captured in step 156, the process ends at step 88 with the generation of an error signal.

Returning to step 160, if the write command is not captured, a determination that a far boundary condition does not exist is made and in step 164, the DQS signal 54 is adjusted by a value, for example, +0.75 tCK (e.g., the opposite value of the sum of the values used in steps 150 and 158) without any corresponding adjustment to the original WICA value. A sanity check is performed is then performed in step 156 (i.e., determining if the write command is captured with the original WICA value) and if the write command is captured, the fine tuning process of the internal WL begins at step 78. Alternatively, if the write command is not captured in step 156, the process ends at step 88 with the generation of an error signal.

In this manner, method 146 allows for detection of boundary cases/conditions (e.g., maximum boundary case 120 and minimum boundary case 130) as well as correction of the resulting DQS signal 54 having an offset outside of a given specification or tolerance of the memory device 10 via modification of the WICA value (i.e., by allowing for a finer resolution for the value of WICA that alters the resultant tDQSoffset). Examples of timing situations that may occur when implementing the internal WL method 146 are described below with respect to FIGS. 8 and 9.

Figure 8:
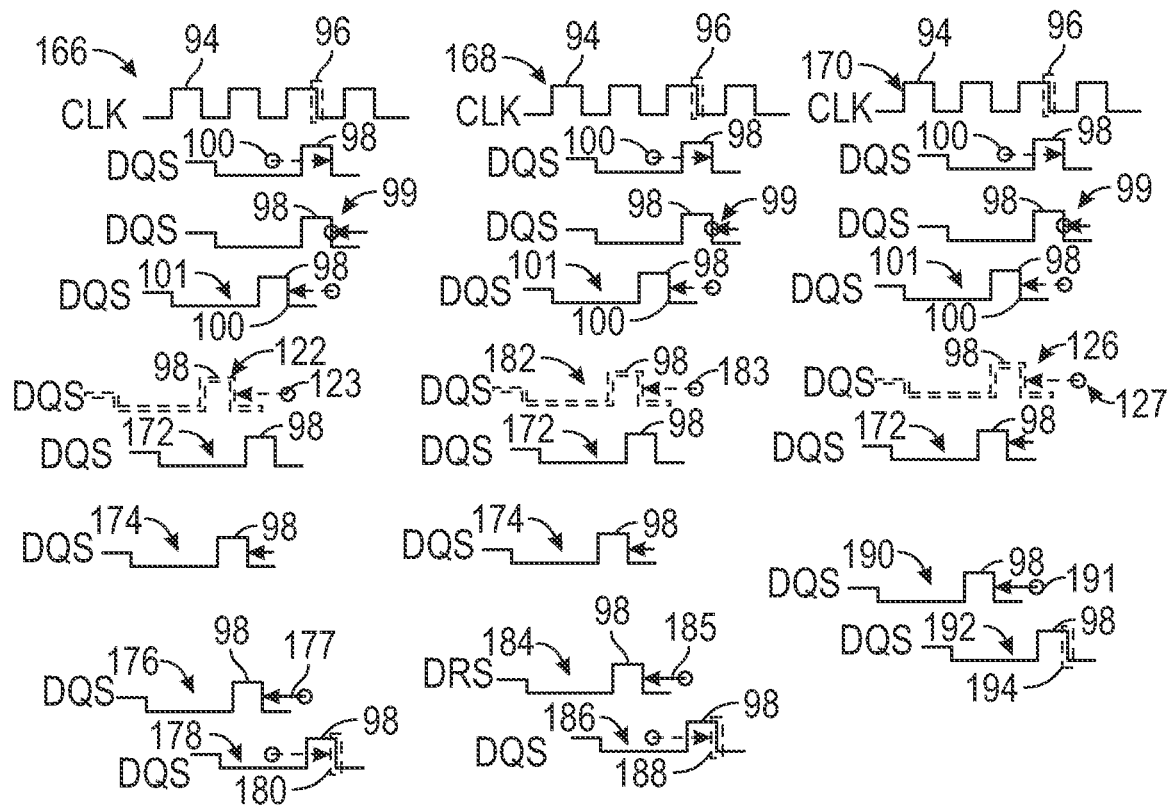
FIG. 8 is a diagram illustrating a first example inclusive of a minimum boundary case and a maximum boundary case in conjunction with the internal write leveling of FIG. 7, in accordance with an embodiment.

FIG. 8 illustrates a diagram of a minimum boundary case 166, a non-boundary case 168, and a maximum boundary case 170 for the DQS signal 54 that results in a final offset (e.g., tDQSoffset) within half a clock earlier than the clock (−0.5 tCK) and within half a clock later than the clock (+0.5 tCK) when implementing method 146. It should be noted that the minimum boundary case 166 is similar to the minimum boundary case 118, but will result in a different tDQSoffset and the maximum boundary case 170 is similar to the maximum boundary case 120, but will result in a different tDQSoffset due to the boundary detection and correction process of method 146. As illustrated, the clock waveform 94 of the CLK is present in each of the minimum boundary case 166, the non-boundary case 168, and the maximum boundary case 170. With respect to the minimum boundary case 166, upon conclusion of the external WL (step 66), the DQS signal 54 and the CLK are misaligned (e.g., tDQSoffset is equal to approximately 100 ps). The box 96 on the clock waveform 94 indicates an alignment edge (the preamble fall edge preceding the first data bit).

The DQS pulse 98 has a falling edge 100 used to capture the write command. As previously noted, after external WL (illustrated by waveform 99), the DQS signal 54 and the CLK are misaligned (e.g., tDQSoffset is equal to approximately 100 ps). In conjunction with waveform 101, the DQS pulse 98 has negative timing adjustment applied (associated with step 68). This adjustment may be, for example, −0.75 tCK. WICA is increased (in conjunction with steps 72, 74, 76, and 77) until the falling edge 100 of the DQS pulse 98 captures the write command. With respect to the minimum boundary case 166, the WICA for a given value just barely misses a capture of the write command as it is incremented.

Illustrated for reference is the fine tuning process of method 64 having been undertaken (e.g., steps 78, 80, and 82) resulting in waveform 122. Waveform 122 illustrates that the fine tuning process of method 64 steps back approximately 1 tCK (time 123) until the failing boundary is determined (step 82). However, instead of generation of waveform 122, an adjustment of the DQS signal 54 (step 150) is undertaken. The DQS signal 54 is reduced (i.e., moved negatively) by a value, for example, a quarter of a clock pulse of the CLK (−0.25 tCK), which generates waveform 172.

Step 152 is undertaken and, for the present instance, the write command is captured. This causes a determination to be made that a near boundary condition does not exist. Accordingly, the process (method 146) proceeds to determine whether a far boundary exists. In conjunction with step 158, the DQS signal 54 is reduced (i.e., moved negatively) by a set value, for example, a half of a clock pulse of the CLK (−0.5 tCK). This results in a DQS represented in waveform 174, which illustrates the DQS signal 54 having been adjusted by the sum of the value from step 150 and the value from step 158 (e.g., −0.75 tCK). The boundary test far portion of the boundary condition detection and correction process is undertaken with waveform 174 and in step 160, a determination is made as to whether the write command is captured using the waveform 174.

In the present instance, the capture is successful. Accordingly, a determination that a far boundary condition exists is made and in step 162, the DQS signal 54 is adjusted by a value, for example, +0.75 tCK (e.g., the opposite value of the sum of the values used in steps 150 and 158). Additionally, in step 162, the mode register MR11.7 is enabled (i.e., set to 1), which causes the mode register MR11.7 to allow for the decrease of the effective WICA by 0.5 tCK. Thus, when in step 162 WICA is incremented (i.e., WICA=WICA+1), the net effect will be WICA=WICA+0.5. This operates to provide correction via a finer resolution for the value of WICA when the far boundary condition is found to exist that would otherwise cause the DQS signal 54 to have an offset outside a given specification or tolerance of the memory device 10.

At this time, the fine tuning process of method 146 is undertaken (e.g., steps 78, 80, and 82) resulting in waveform 176. Waveform 176 illustrates that the fine tuning process of method 64 steps back 0.5 tCK (time 177) until the failing boundary is determined (step 82). Thereafter, as illustrated by waveform 178, a positive timing adjustment (e.g., tWL_ADJ_end) is applied to the DQS signal 54. As illustrated, this positive timing adjustment is +1.25 tCK and it results in the DQS pulse 98 having its falling edge 100 used to capture the write command illustrated as being in the box 180 (indicative of the alignment edge of the DQS signal 54). The illustrated waveform 178 represents the final tDQSoffset being 0.25 tCK, i.e., the DQS signal 54 having an offset within a given specification or tolerance of the memory device 10.

With respect to the non-boundary case 168, upon conclusion of the external WL (step 66), the DQS signal 54 and the CLK are similarly misaligned as the DQS signal 54 and the CLK of the minimum boundary case 166 (e.g., tDQSoffset is equal to approximately 100 ps). The box 96 on the clock waveform 94 indicates an alignment edge (the preamble fall edge preceding the first data bit).

The DQS pulse 98 has a falling edge 100 used to capture the write command. As previously noted, after external WL (illustrated by waveform 99), the DQS signal 54 and the CLK are misaligned (e.g., tDQSoffset is equal to approximately 100 ps). In conjunction with waveform 101, the DQS pulse 98 has negative timing adjustment applied (associated with step 68). This adjustment may be, for example, −0.75 tCK. WICA is increased (in conjunction with steps 72, 74, 76, and 77) until the falling edge 100 of the DQS pulse 98 captures the write command.

Illustrated for reference is the fine tuning process of method 64 having been undertaken (e.g., steps 78, 80, and 82) resulting in waveform 182. Waveform 182 illustrates that the fine tuning process of method 64 steps back approximately 0.5 tCK (time 183) until the failing boundary is determined (step 82). However, instead of generation of waveform 182, an adjustment of the DQS signal 54 (step 150) is undertaken. The DQS signal 54 is reduced (i.e., moved negatively) by a value, for example, a quarter of a clock pulse of the CLK (−0.25 tCK), which generates waveform 172.

Step 152 is undertaken and, for the present instance, the write command is captured. This causes a determination to be made that a near boundary condition does not exist. Accordingly, the process (method 146) proceeds to determine whether a far boundary exists. In conjunction with step 158, the DQS signal 54 is reduced (i.e., moved negatively) by a set value, for example, a half of a clock pulse of the CLK (−0.5 tCK). This results in a DQS represented in waveform 174, which illustrates the DQS signal 54 having been adjusted by the sum of the value from step 150 and the value from step 158 (e.g., −0.75 tCK). The boundary test far portion of the boundary condition detection and correction process is undertaken with waveform 174 and in step 160, a determination is made as to whether the write command is captured using the waveform 174.

In the present instance, the capture is unsuccessful. Accordingly, a determination that a far boundary condition does not exist is made and in step 164, the DQS signal 54 is adjusted by a value, for example, +0.75 tCK (e.g., the opposite value of the sum of the values used in steps 150 and 158) without any corresponding adjustment to the original WICA value. At this time, the fine tuning process of method 146 is undertaken (e.g., steps 78, 80, and 82) resulting in waveform 184. Waveform 184 illustrates that the fine tuning process of method 64 steps back 0.5 tCK (time 185) until the failing boundary is determined (step 82). Thereafter, as illustrated by waveform 186, a positive timing adjustment (e.g., tWL_ADJ_end) is applied to the DQS signal 54. As illustrated, this positive timing adjustment is +1.25 tCK and it results in the DQS pulse 98 having its falling edge 100 used to capture the write command illustrated as being in the box 188 (indicative of the alignment edge of the DQS signal 54). The illustrated waveform 186 represents the final tDQSoffset being 0.25 tCK, i.e., the DQS signal 54 having an offset within a given specification or tolerance of the memory device 10.

With respect to the maximum boundary case 170, upon conclusion of the external WL (step 66), the DQS signal 54 and the CLK are similarly misaligned as the DQS signal 54 and the CLK of the minimum boundary case 166 (e.g., tDQSoffset is equal to approximately 100 ps). The box 96 on the clock waveform 94 indicates an alignment edge (the preamble fall edge preceding the first data bit).

The DQS pulse 98 has a falling edge 100 used to capture the write command. As previously noted, after external WL (illustrated by waveform 99), the DQS signal 54 and the CLK are misaligned (e.g., tDQSoffset is equal to approximately 100 ps). In conjunction with waveform 101, the DQS pulse 98 has negative timing adjustment applied (associated with step 68). This adjustment may be, for example, −0.75 tCK. WICA is increased (in conjunction with steps 72, 74, 76, and 77) until the falling edge 100 of the DQS pulse 98 captures the write command.

Illustrated for reference is the fine tuning process of method 64 having been undertaken (e.g., steps 78, 80, and 82) resulting in waveform 126. Waveform 126 illustrates that the fine tuning process of method 64 steps back −0.1 ps (time 127) until the failing boundary is determined (step 82). However, instead of generation of waveform 126, an adjustment of the DQS signal 54 (step 150) is undertaken. The DQS signal 54 is reduced (i.e., moved negatively) by a value, for example, a quarter of a clock pulse of the CLK (−0.25 tCK), which generates waveform 172.

Step 152 is undertaken and, for the present instance, the write command is not captured. This causes a determination to be made that a near boundary condition exists. Accordingly, the process (method 146) undertakes step 154 and the DQS signal 54 is adjusted by a value, for example, +0.25 tCK (e.g., the opposite value of that used in step 150). Additionally, in step 154, the mode register MR11.7 is enabled (i.e., set to 1), which causes the mode register MR11.7 to allow for the decrease of the effective WICA by 0.5 tCK. Thus, when in step 154 WICA is incremented (i.e., WICA=WICA+1), the net effect will be WICA=WICA+0.5. This operates to provide correction via a finer resolution for the value of WICA when the near boundary condition is found to exist that would otherwise cause the DQS signal 54 to have an offset outside a given specification or tolerance of the memory device 10.

At this time, the fine tuning process of method 146 is undertaken (e.g., steps 78, 80, and 82) resulting in waveform 190. Waveform 190 illustrates that the fine tuning process of method 64 steps back 0.5 tCK (time 191) until the failing boundary is determined (step 82). Thereafter, as illustrated by waveform 192, a positive timing adjustment (e.g., tWL_ADJ_end) is applied to the DQS signal 54. As illustrated, this positive timing adjustment is +1.25 tCK and it results in the DQS pulse 98 having its falling edge 100 used to capture the write command illustrated as being in the box 194 (indicative of the alignment edge of the DQS signal 54). The illustrated waveform 208 represents the final tDQSoffset being 0.25 tCK, i.e., the DQS signal 54 having an offset within a given specification or tolerance of the memory device 10. This is in contrast to the boundary case (maximum boundary case 120) described above whereby a given WICA value results in barely capturing the write command and that also results in the DQS signal 54 having an offset outside of a given specification or tolerance of the memory device 10. In this manner, method 146 operates to correct an offset to allow for proper operation within a given specification or tolerance of the memory device 10 when faced with a maximum boundary and an initially non-aligned DQS signal 54 and CLK.

Figure 9:
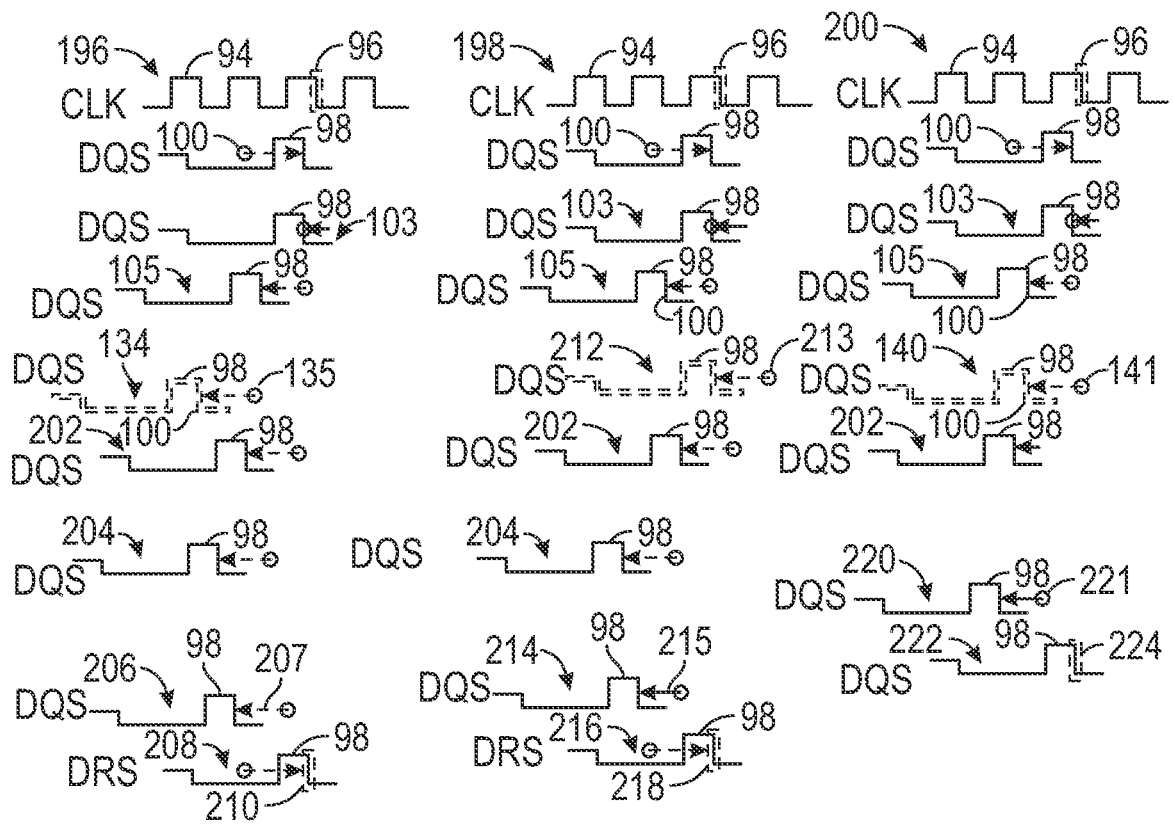
FIG. 9 is a diagram illustrating a second example inclusive of a minimum boundary case and a maximum boundary case in conjunction with the internal write leveling of FIG. 7, in accordance with an embodiment.

FIG. 9 illustrates a diagram of a minimum boundary case 196, a non-boundary case 198, and a maximum boundary case 200 for the DQS signal 54 that results in a final offset (e.g., tDQSoffset) within half a clock earlier than the clock (−0.5 tCK) and within half a clock later than the CLK (+0.5 tCK) when implementing method 146. It should be noted that the minimum boundary case 196 is similar to the minimum boundary case 130, but will result in a different tDQSoffset and the maximum boundary case 200 is similar to the maximum boundary case 132, but will result in a different tDQSoffset due to the boundary detection and correction process of method 146. As illustrated, the clock waveform 94 of the CLK is present in each of the minimum boundary case 196, the non-boundary case 198, and the maximum boundary case 200. With respect to the minimum boundary case 196, upon conclusion of the external WL (step 66), the DQS signal 54 and the CLK are misaligned (e.g., tDQSoffset is equal to approximately −100 ps). The box 96 on the clock waveform 94 indicates an alignment edge (the preamble fall edge preceding the first data bit).

The DQS pulse 98 has a falling edge 100 used to capture the write command. As previously noted, after external WL (illustrated by waveform 103), the DQS signal 54 and the CLK are misaligned (e.g., tDQSoffset is equal to approximately −100 ps). In conjunction with waveform 105, the DQS pulse 98 has negative timing adjustment applied (associated with step 68). This adjustment may be, for example, −0.75 tCK. WICA is increased (in conjunction with steps 72, 74, 76, and 77) until the falling edge 100 of the DQS pulse 98 captures the write command. With respect to the minimum boundary case 196, the WICA for a given value just barely misses a capture of the write command as it is incremented.

Illustrated for reference is the fine tuning process of method 64 having been undertaken (e.g., steps 78, 80, and 82) resulting in waveform 134. Waveform 134 illustrates that the fine tuning process of method 64 steps back approximately 1 tCK (time 135) until the failing boundary is determined (step 82). However, instead of generation of waveform 134, an adjustment of the DQS signal 54 (step 150) is undertaken. The DQS signal 54 is reduced (i.e., moved negatively) by a value, for example, a quarter of a clock pulse of the CLK (−0.25 tCK), which generates waveform 202.

Step 152 is undertaken and, for the present instance, the write command is captured. This causes a determination to be made that a near boundary condition does not exist. Accordingly, the process (method 146) proceeds to determine whether a far boundary exists. In conjunction with step 158, the DQS signal 54 is reduced (i.e., moved negatively) by a set value, for example, a half of a clock pulse of the CLK (−0.5 tCK). This results in a DQS signal 54 represented in waveform 204, which illustrates the DQS signal 54 having been adjusted by the sum of the value from step 150 and the value from step 158 (e.g., −0.75 tCK). The boundary test far portion of the boundary condition detection and correction process is undertaken with waveform 204 and in step 160, a determination is made as to whether the write command is captured using the waveform 204.

In the present instance, the capture is successful. Accordingly, a determination that a far boundary condition exists is made and in step 162, the DQS signal 54 is adjusted by a value, for example, +0.75 tCK (e.g., the opposite value of the sum of the values used in steps 150 and 158). Additionally, in step 162, the mode register MR11.7 is enabled (i.e., set to 1), which causes the mode register MR11.7 to allow for the decrease of the effective WICA by 0.5 tCK. Thus, when in step 162 WICAhalfStep is enabled, the net effect will be WICA=WICA−0.5. This operates to provide correction via a finer resolution for the value of WICA when the far boundary condition is found to exist that would otherwise cause the DQS signal 54 to have an offset outside a given specification or tolerance of the memory device 10.

At this time, the fine tuning process of method 146 is undertaken (e.g., steps 78, 80, and 82) resulting in waveform 206. Waveform 206 illustrates that the fine tuning process of method 64 steps back 0.5 tCK (time 207) until the failing boundary is determined (step 82). Thereafter, as illustrated by waveform 208, a positive timing adjustment (e.g., tWL_ADJ_end) is applied to the DQS signal 54. As illustrated, this positive timing adjustment is +1.25 tCK and it results in the DQS pulse 98 having its falling edge 100 used to capture the write command illustrated as being in the box 210 (indicative of the alignment edge of the DQS signal 54). The illustrated waveform 208 represents the final tDQSoffset being −0.35 tCK, i.e., the DQS signal 54 having an offset within a given specification or tolerance of the memory device 10. This is in contrast to the boundary case (minimum boundary case 130) described above whereby a given WICA value results in barely missing capturing the write command and that also results in the DQS signal 54 having an offset outside of a given specification or tolerance of the memory device 10. In this manner, method 146 operates to correct an offset to allow for proper operation within a given specification or tolerance of the memory device 10 when faced with a minimum boundary and an initially non-aligned DQS signal 54 and CLK.

With respect to the non-boundary case 198, upon conclusion of the external WL (step 66), the DQS signal 54 and the CLK are similarly misaligned as the DQS signal 54 and the CLK of the minimum boundary case 166 (e.g., tDQSoffset is equal to approximately −100 ps). The box 96 on the clock waveform 94 indicates an alignment edge (the preamble fall edge preceding the first data bit).

The DQS pulse 98 has a falling edge 100 used to capture the write command. As previously noted, after external WL (illustrated by waveform 103), the DQS signal 54 and the CLK are misaligned (e.g., tDQSoffset is equal to approximately −100 ps). In conjunction with waveform 105, the DQS pulse 98 has negative timing adjustment applied (associated with step 68). This adjustment may be, for example, −0.75 tCK. WICA is increased (in conjunction with steps 72, 74, 76, and 77) until the falling edge 100 of the DQS pulse 98 captures the write command.

Illustrated for reference is the fine tuning process of method 64 having been undertaken (e.g., steps 78, 80, and 82) resulting in waveform 212. Waveform 212 illustrates that the fine tuning process of method 64 steps back approximately 0.5 tCK (time 183) until the failing boundary is determined (step 82). However, instead of generation of waveform 212, an adjustment of the DQS signal 54 (step 150) is undertaken. The DQS signal 54 is reduced (i.e., moved negatively) by a value, for example, a quarter of a clock pulse of the CLK (−0.25 tCK), which generates waveform 202.

Step 152 is undertaken and, for the present instance, the write command is captured. This causes a determination to be made that a near boundary condition does not exist. Accordingly, the process (method 146) proceeds to determine whether a far boundary exists. In conjunction with step 158, the DQS signal 54 is reduced (i.e., moved negatively) by a set value, for example, a half of a clock pulse of the CLK (−0.5 tCK). This results in a DQS signal 54 represented in waveform 204, which illustrates the DQS signal 54 having been adjusted by the sum of the value from step 150 and the value from step 158 (e.g., −0.75 tCK). The boundary test far portion of the boundary condition detection and correction process is undertaken with waveform 204 and in step 160, a determination is made as to whether the write command is captured using the waveform 204.

In the present instance, the capture is unsuccessful. Accordingly, a determination that a far boundary condition does not exist is made and in step 164, the DQS signal 54 is adjusted by a value, for example, +0.75 tCK (e.g., the opposite value of the sum of the values used in steps 150 and 158) without any corresponding adjustment to the original WICA value. At this time, the fine tuning process of method 146 is undertaken (e.g., steps 78, 80, and 82) resulting in waveform 214. Waveform 214 illustrates that the fine tuning process of method 64 steps back 0.5 tCK (time 215) until the failing boundary is determined (step 82). Thereafter, as illustrated by waveform 216, a positive timing adjustment (e.g., tWL_ADJ_end) is applied to the DQS signal 54. As illustrated, this positive timing adjustment is +1.25 tCK and it results in the DQS pulse 98 having its falling edge 100 used to capture the write command illustrated as being in the box 218 (indicative of the alignment edge of the DQS signal 54). The illustrated waveform 216 represents the final tDQSoffset being −0.25 tCK, i.e., the DQS signal 54 having an offset within a given specification or tolerance of the memory device 10.

With respect to the maximum boundary case 200, upon conclusion of the external WL (step 66), the DQS signal 54 and the CLK are similarly misaligned as the DQS signal 54 and the CLK of the minimum boundary case 166 (e.g., tDQSoffset is equal to approximately −100 ps). The box 96 on the clock waveform 94 indicates an alignment edge (the preamble fall edge preceding the first data bit).

The DQS pulse 98 has a falling edge 100 used to capture the write command. As previously noted, after external WL (illustrated by waveform 103), the DQS signal 54 and the CLK are misaligned (e.g., tDQSoffset is equal to approximately −100 ps). In conjunction with waveform 105, the DQS pulse 98 has negative timing adjustment applied (associated with step 68). This adjustment may be, for example, −0.75 tCK. WICA is increased (in conjunction with steps 72, 74, 76, and 77) until the falling edge 100 of the DQS pulse 98 captures the write command.

Illustrated for reference is the fine tuning process of method 64 having been undertaken (e.g., steps 78, 80, and 82) resulting in waveform 140. Waveform 140 illustrates that the fine tuning process of method 64 steps back −0.1 ps (time 141) until the failing boundary is determined (step 82). However, instead of generation of waveform 140, an adjustment of the DQS signal 54 (step 150) is undertaken. The DQS signal 54 is reduced (i.e., moved negatively) by a value, for example, a quarter of a clock pulse of the CLK (−0.25 tCK), which generates waveform 202.

Step 152 is undertaken and, for the present instance, the write command is not captured. This causes a determination to be made that a near boundary condition exists. Accordingly, the process (method 146) undertakes step 154 and the DQS signal 54 is adjusted by a value, for example, +0.25 tCK (e.g., the opposite value of that used in step 150). Additionally, in step 154, the mode register MR11.7 is enabled (i.e., set to 1), which causes the mode register MR11.7 to allow for the decrease of the effective WICA by 0.5 tCK. Thus, when in step 154 WICA is incremented (i.e., WICA=WICA+1), the net effect will be WICA=WICA+0.5. This operates to provide correction via a finer resolution for the value of WICA when the near boundary condition is found to exist that would otherwise cause the DQS signal 54 to have an offset outside a given specification or tolerance of the memory device 10.

At this time, the fine tuning process of method 146 is undertaken (e.g., steps 78, 80, and 82) resulting in waveform 220. Waveform 220 illustrates that the fine tuning process of method 64 steps back 0.5 tCK (time 221) until the failing boundary is determined (step 82). Thereafter, as illustrated by waveform 222, a positive timing adjustment (e.g., tWL_ADJ_end) is applied to the DQS signal 54. As illustrated, this positive timing adjustment is +1.25 tCK and it results in the DQS pulse 98 having its falling edge 100 used to capture the write command illustrated as being in the box 224 (indicative of the alignment edge of the DQS signal 54). The illustrated waveform 222 represents the final tDQSoffset being −0.25 tCK, i.e., the DQS signal 54 having an offset within a given specification or tolerance of the memory device 10.

Figure 10:
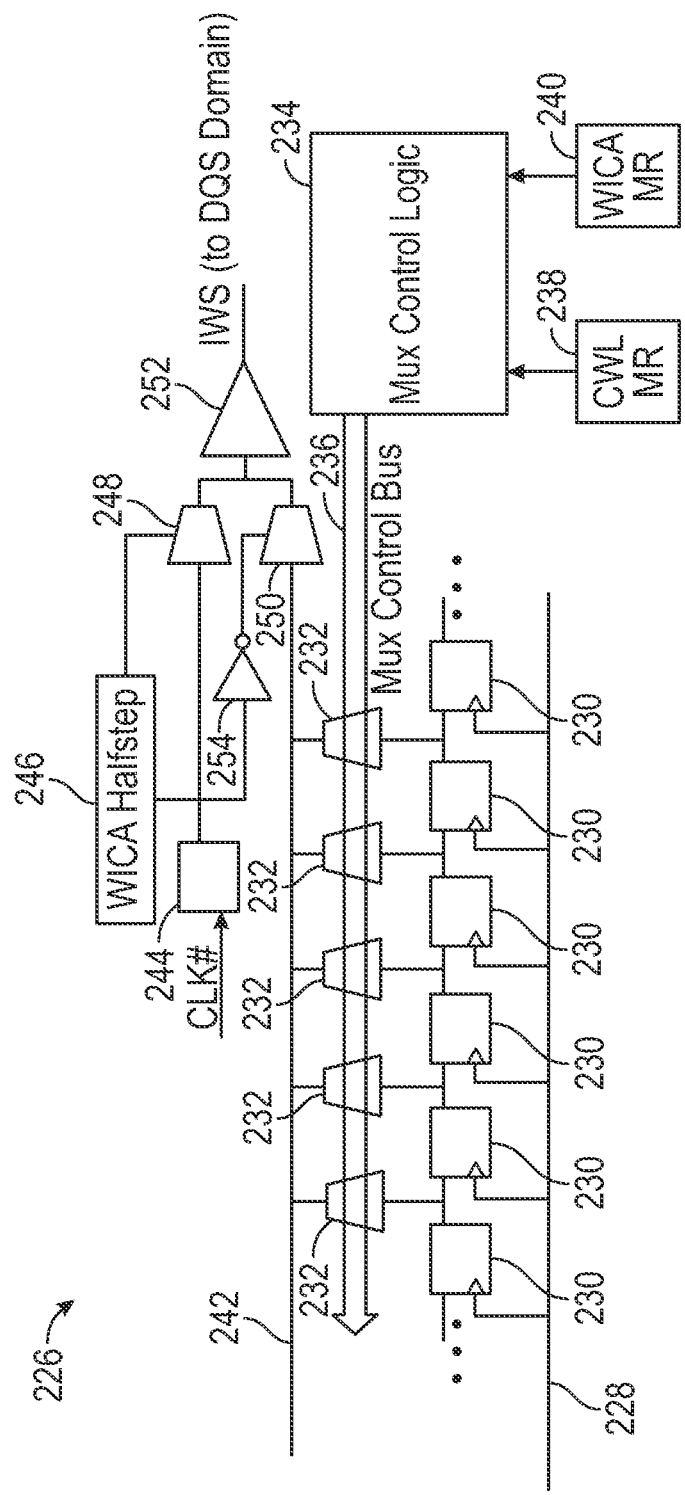
FIG. 10 is a schematic diagram of a portion of the IWA of FIG. 2, in accordance with an embodiment.

As demonstrated in the examples illustrated in FIGS. 8 and 9, the method 146 operates to implement a boundary condition detection and correction process that allows for detection of boundary cases/conditions (e.g., maximum boundary case 170 and minimum boundary case 196) as well as correction of the resulting DQS signal 54 that would otherwise have an offset outside of a given specification or tolerance of the memory device 10 via modification of the WICA value (i.e., by allowing for a finer resolution for the value of WICA that alters the resultant tDQSoffset). FIG. 10 illustrates a portion of the IWA circuitry 48 used in implementation and/or execution of the method 146.

FIG. 10 is a schematic diagram of a CAS-write-latency (CWL) shifter 226 as a portion of the IWA circuitry 48. The CWL shifter 226 receives the CLK along path 228 as well as a write command. The CLK is transmitted to a plurality of flip-flop circuits 230 as an input clock signal. The outputs of the individual flip-flop circuits 230 are each transmitted to a respective multiplexer 232, whereby the multiplexers 232 are controlled via control signals generated by a multiplexer control logic 234 and transmitted via a multiplexer control bus 236. The multiplexer control logic 234 operates to generate the control signals based upon received inputs from a CWL mode register 238 as well as a WICA mode register 240, which may be MR3.3:0. In some embodiments, the CWL shifter 226 may count clock cycles based on a setting of the CWL mode register 238. Additionally, the control signals may operate to select transmission of the write command along path 242 from one of the multiplexers 232.

Additionally, the CWL shifter 226 includes an additional flip-flop 244 that receives as a clocking signal an inverse of CLK (i.e., 180 degrees out of phase with CLK). The CWL shifter additionally includes a WICAhalfstep mode register 246. The WICAhalfstep mode register 246 may be, for example, mode register MR11.7 and when enabled, the WICAhalfstep mode register 246 allows for the decrease of the effective WICA by 0.5 tCK. The output of the WICAhalfstep mode register 246 operates to control each of multiplexer 248 and multiplexer 250. As illustrated, the output of the WICAhalfstep mode register 246, when enabled, activates multiplexer 248, allowing the write command from flip-flop 244 to be transmitted to buffer 252 to be output from the CWL shifter 226 as the IWS 58. This occurs when, for example, the WICAhalfstep mode register 246 has been enabled (e.g., set to 1) in either of steps 154 or 162, thus changing which clock cycle on which the write command is shifted out from the CWL shifter 226 as the IWS 58. Likewise, the output of the WICAhalfstep mode register 246, when disabled, activates multiplexer 250 (having passed through inverter 254), thus allowing the write command from the path 242 to be transmitted to buffer 252 to be output from the CWL shifter 226 as the IWS 58 (i.e., without influence from the WICAhalfstep mode register 246 and, thus, without alteration of the resolution of the WICA value as described above in conjunction with steps 154 and 162 of FIG. 7).

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An internal write adjust apparatus, comprising:
a mode register configured to transmit a control signal based upon a stored indication in the mode register; and
a multiplexer configured to receive the control signal and a write command, wherein the multiplexer is configured to selectively transmit the write command based on a value of the control signal, wherein the mode register is configured to receive the stored indication as indicative of whether a phase alignment between an internal data strobe (DQS) signal of a memory device and a clock of the memory device are outside a predetermined amount of phase mismatch with one another.

2. The internal write adjust apparatus of claim 1, comprising a second multiplexer configured to receive a second write command, wherein the second multiplexer is configured to selectively transmit the second write command.

3. The internal write adjust apparatus of claim 2, comprising an inverter coupled to the mode register and the second multiplexer, wherein the inverter is configured to receive the control signal and invert the control signal to an inverted control signal having second value differing from the value of the control signal, wherein the second multiplexer is configured to receive the inverted control signal and selectively transmit the second write command based on the second value of the inverted control signal.

4. The internal write adjust apparatus of claim 2, comprising an output configured to transmit one of the first write command and the second write command as an internal write signal (IWS) to capture a data signal (DQ) using the IWS.

5. The internal write adjust apparatus of claim 1, wherein the stored indication is set to a first value upon detection of a first boundary condition between the DQS signal and the clock.

6. The internal write adjust apparatus of claim 5, wherein the stored indication is set to the first value upon detection of a second boundary condition between the DQS signal and the clock.

7. The internal write adjust apparatus of claim 6, wherein the stored indication is set to a second value upon no detection of the first boundary condition and no detection of the second boundary condition.

8. An internal write adjust apparatus, comprising:
a mode register configured to transmit a control signal; and
internal write adjust circuitry configured to transmit a first write command based on a value of the control signal which is determined responsive to a phase difference between an internal data strobe (DQS) signal of a memory device and a clock signal.

9. The internal write adjust apparatus of claim 8, comprising a second internal write adjust circuitry configured to transmit a second write command based on the value of the control signal.

10. The internal write adjust apparatus of claim 9, wherein the internal write adjust circuitry is configured to transmit the first write command when the value of the control signal comprises a first value, wherein the second internal write adjust circuitry is configured to transmit the second write command when the value of the control signal comprises a second value.

11. The internal write adjust apparatus of claim 9, comprising an output configured to transmit one of the first write command and the second write command as an internal write signal (IWS) to capture a data signal (DQ) using the IWS.

12. The internal write adjust apparatus of claim 8, wherein the mode register is configured to set the value of the control signal to a first value is upon detection of a first boundary condition between the DQS signal and the clock signal.

13. The internal write adjust apparatus of claim 12, wherein the mode register is configured to set the value of the control signal to the first value upon detection of a first boundary condition between the DQS signal and the clock signal.

14. The internal write adjust apparatus of claim 13, wherein the mode register is configured to set the value of the control signal to a second value upon no detection of the first boundary condition and no detection of the second boundary condition.

15. A method, comprising:
determining a difference between an internal data strobe (DQS) signal of a memory device and a clock signal;
setting a value of a control signal based on the determining of the difference between the internal DQS signal and the clock signal;
transmitting the control signal to control transmission of a first write command when the value comprises a first value.

16. The method of claim 15, comprising transmitting the control signal to control transmission of a second write command when the value comprises a second value.

17. The method of claim 16, comprising transmitting one of the first write command and the second write command as an internal write signal (IWS) to capture a data signal (DQ) using the IWS.

18. The method of claim 16, comprising setting the value of the control signal to the first value upon detection of a first boundary condition between the DQS signal and the clock signal.

19. The method of claim 18, comprising setting the value of the control signal to the first value upon detection of a second boundary condition between the DQS signal and the clock signal.

20. The method of claim 19, comprising setting the value of the control signal to a second value upon no detection of the first boundary condition and no detection of the second boundary condition.

* * * * *